(12) United States Patent
Yasukawa

(10) Patent No.: US 7,755,281 B2
(45) Date of Patent: Jul. 13, 2010

(54) ELECTROLUMINESCENT DEVICE HAVING ISLAND-SHAPED BARRIER LAYERS

(75) Inventor: Koji Yasukawa, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 253 days.

(21) Appl. No.: 11/677,839

(22) Filed: Feb. 22, 2007

(65) Prior Publication Data

US 2007/0205717 A1    Sep. 6, 2007

(30) Foreign Application Priority Data

Mar. 6, 2006   (JP) ............... 2006-058989
Dec. 25, 2006  (JP) ............... 2006-347213

(51) Int. Cl.
     *H01J 1/62* (2006.01)
(52) U.S. Cl. ..................................... 313/506
(58) Field of Classification Search .......... 313/498–512
     See application file for complete search history.

(56) References Cited

U.S. PATENT DOCUMENTS

| | | |
|---|---|---|
| 6,861,710 B2 | 3/2005 | Murakami et al. |
| 7,033,848 B2 | 4/2006 | Murakami et al. |
| 7,492,012 B2 | 2/2009 | Murakami et al. |
| 2002/0043929 A1* | 4/2002 | Tazawa ..................... 313/506 |
| 2003/0209708 A1* | 11/2003 | Kubota ....................... 257/40 |
| 2004/0004434 A1* | 1/2004 | Nishi et al. ................. 313/506 |
| 2004/0113541 A1* | 6/2004 | Watanabe et al. ........... 313/500 |
| 2005/0140277 A1* | 6/2005 | Suzuki et al. ............... 313/504 |
| 2005/0269948 A1* | 12/2005 | Tanaka ....................... 313/504 |

FOREIGN PATENT DOCUMENTS

| | | |
|---|---|---|
| JP | A 2002-100469 | 4/2002 |
| JP | A-2003-197367 | 7/2003 |
| JP | A 2003-282238 | 10/2003 |
| JP | A 2003-282240 | 10/2003 |
| JP | A 2003-297551 | 10/2003 |
| JP | A 2004-134151 | 4/2004 |

* cited by examiner

*Primary Examiner*—Nimeshkumar D. Patel
*Assistant Examiner*—Peter R Haderlein
(74) *Attorney, Agent, or Firm*—Oliff & Berridge, PLC

(57) ABSTRACT

An electroluminescent device includes a substrate and a plurality of electroluminescent elements disposed on the substrate. Each electroluminescent element includes a first electrode, a second electrode, and a function layer including a luminescent layer and disposed between the first electrode and the second electrode. The electroluminescent elements are grouped into a plurality of groups each including at least one electroluminescent element. Barrier layers are disposed in an island-shaped manner corresponding to regions where the electroluminescent elements are disposed, and each barrier layer prevents water from transferring from the substrate to the electroluminescent element in the corresponding group.

8 Claims, 6 Drawing Sheets

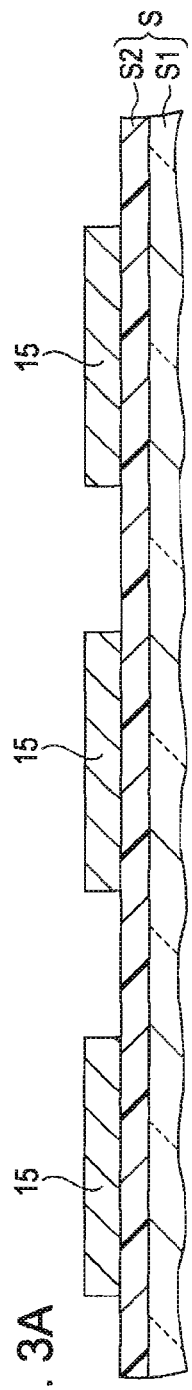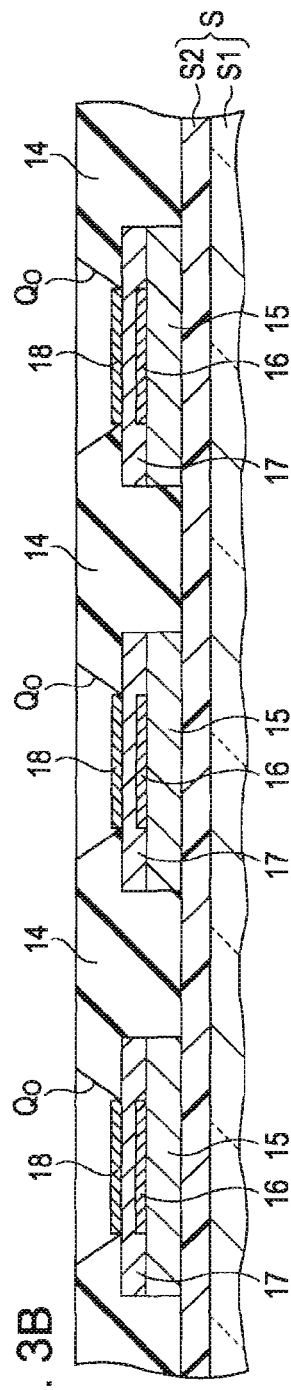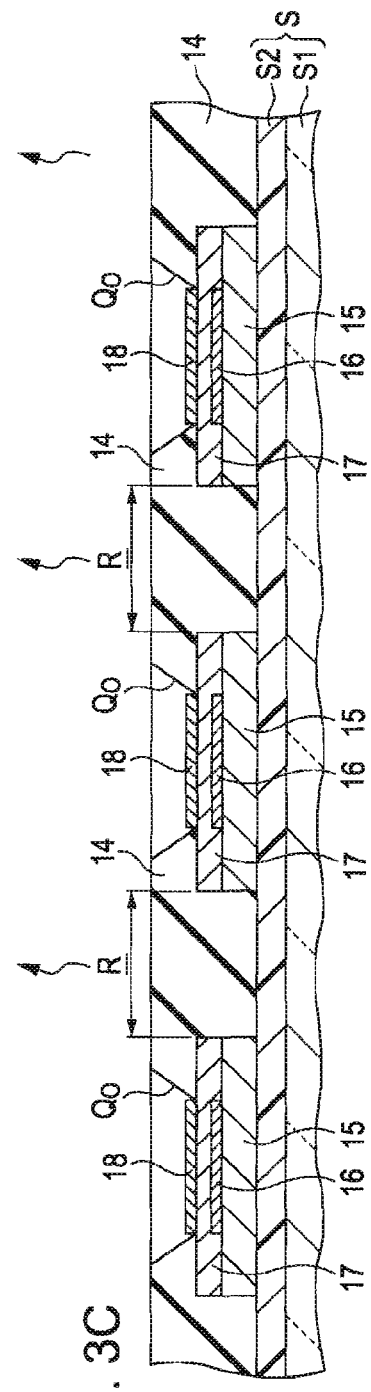

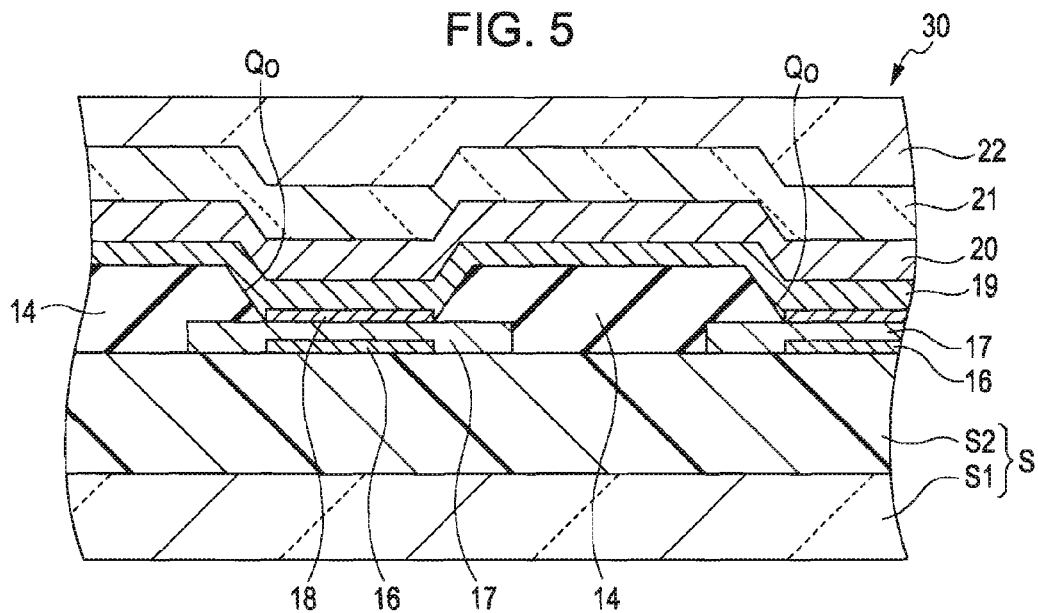
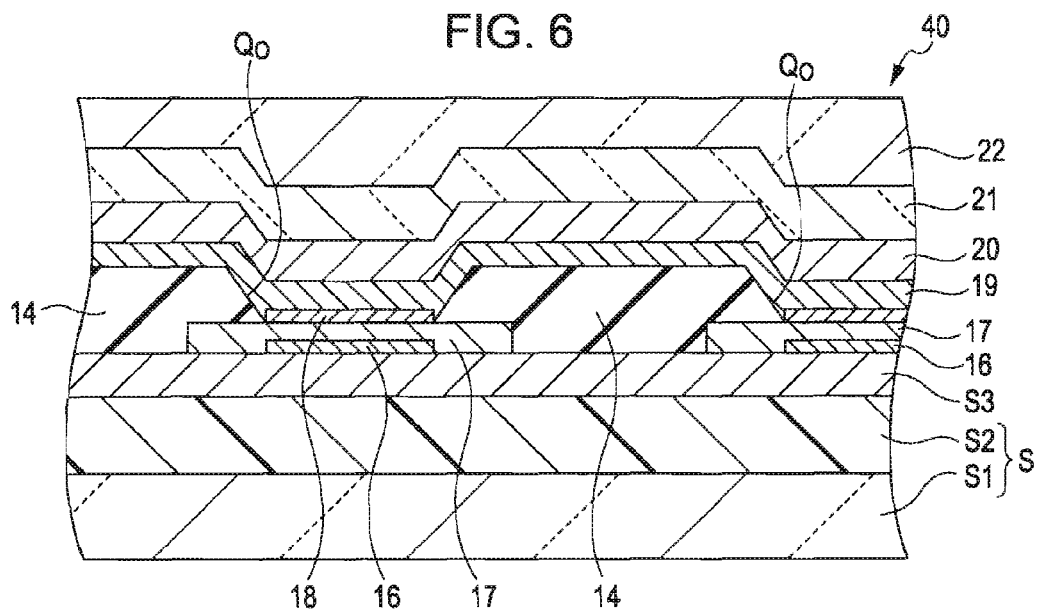

ELECTROLUMINESCENT DEVICE HAVING ISLAND-SHAPED BARRIER LAYERS

BACKGROUND

1. Technical Field

The present invention relates to an electroluminescent device.

2. Related Art

From the viewpoint of reducing weight, thickness, and power consumption, electroluminescent devices have been developed actively, such as a display and an exposure head that include an organic electroluminescent element for each pixel. Such an organic electroluminescent element (hereinafter referred to as organic EL element) generally has the structure in which a luminescent layer made of an organic material is disposed between two electrodes. For a display or the like, such an organic EL element constitutes a pixel and a plurality of pixels are arranged in a matrix manner on a substrate. For an active matrix light-emitting device, thin film transistors (TFTs) are provided on the substrate to control driving current applied to the organic EL elements, and a planarizing layer is formed over the TFTs. The organic EL elements are disposed on the planarizing layer.

The organic EL element is liable to be degraded by water. Specifically, if water permeates the organic EL element the material of the luminescent layer may be altered, or the luminescent layer may separate from the electrode (cathode) and consequently carriers (electrons) are not supplied to the luminescent layer from the cathode. As a result, a so-called dark spot is produced, where part or the entirety of the pixel cannot emit light all the time. If the planarizing layer contains water, the water is heated by heat from the TFTs and the luminescent layer, and the water transfers from the planarizing layer and permeates into the luminescent layer through the electrode, so that a dark spot is undesirably produced.

Accordingly, for example, Japanese Unexamined Patent Application Publication No. 2003-297551 has disclosed a structure in which a moisture-proof inorganic barrier layer is formed of silicon oxynitride over the entire surface of the planarizing layer at the organic EL element side to prevent water from permeating into the organic EL element from the planarizing layer.

However, even in the structure disclosed in the above-cited document, in which the inorganic barrier layer is formed over the entire surface of the planarizing layer, if a defect such as a pinhole is formed in the inorganic barrier layer, water can undesirably permeate into the organic EL element through the defect.

SUMMARY

In advantage of some aspects of the invention is that it provides an electroluminescent device in which the degradation of light-emitting characteristics by water is prevented with reliability.

According to an aspect of the invention, an electroluminescent device is provided which includes a substrate and a plurality of electroluminescent elements disposed on the substrate. Each electroluminescent element includes a first electrode, a second electrode, and a function layer including a luminescent layer and disposed between the first electrode and the second electrode. The electroluminescent elements are grouped into a plurality of groups each including at least one electroluminescent element. Barrier layers are disposed in an island-shaped manner corresponding to regions where the electroluminescent elements are disposed, and each barrier layer prevents water from transferring from the substrate to the electroluminescent element in the corresponding group.

In this structure, the barrier layers are provided in an island-shaped manner on the substrate corresponding to regions where the electroluminescent elements are formed. Hence, there are regions having no barrier layer between any two adjacent barrier layers. Therefore, by heating the substrate in a stage between the formation of the barrier layers and the formation of the function layer, water contained in the substrate can be vaporize and released to the outside through the regions having no barrier layer. Then, the function layer and the electrode are formed over the substrate to complete the electroluminescent elements. Thus, water contained in the substrate can be minimized. In addition, the barrier layers under the respective electroluminescent elements can prevent the permeation into the function layer of water remaining in the substrate, that is, water left in the substrate without being released to the outside in the manufacturing process. Thus, the occurrence of a dark spot can be prevented with reliability.

The substrate used herein includes a layer (circuit-forming layer) having TFTs and other electronic elements on, for example, a non-alkali glass substrate.

The electroluminescent device may further include a light reflection layer between the first electrode and each barrier layer. The light reflection layer reflects light emitted from the luminescent layer to direct the light to the second electrode. In this instance, the second electrode is optically transparent.

This structure is of a so-called top emission type, in which light emitted from the luminescent layer is reflected at the light reflection layer and extracted to the outside through the second electrode. Thus, the degradation of light-emitting characteristics by water can be prevented with reliability in such a top emission type electroluminescent device.

The electroluminescent device may further include an insulating layer isolating the electroluminescent elements from each other on the substrate. The insulating layer is made of a constituent material of the substrate.

Consequently, water contained in the substrate can permeate into the insulating layer and thus can be easily released from the surface of the insulating layer to the outside. Since the water in the substrate is thus reduced, the degradation of the light-emitting characteristics by the water can be prevented with reliability.

The barrier layers may be made of silicon nitride.

The silicon nitride barrier layer can prevent water contained in the substrate from permeating into the function layer with reliability.

Alternatively, the barrier layer may be made of silicon oxynitride.

While silicon nitride (SiN) has a closely packed crystal structure and can warp depending on the material of the substrate, silicon oxynitride (SiON) does not warp because of its lower stress than the stress of the silicon nitride (SiN). Accordingly, the silicon oxynitride barrier layer can be formed on the substrate with reliability.

The electroluminescent device may further include an optically transparent light transmission layer between the light reflection layer and the first electrode. In this instance, the second electrode is optically semitransparent. The light transmission layer adjusts the optical distance between the second electrode and the reflection layer.

By varying the thickness of the light transmission layer, the optical distance between the light reflection layer and the second electrode can be adjusted. Thus, the degradation of light-emitting characteristics by water can be prevented with reliability in electroluminescent devices having a so-called micro-cavity structure, in which light emitted from the luminescent layer is reflected between the light reflection layer and the second electrode so that light having a predetermined wavelength can be enhanced and emitted to the outside.

If the light transmission layer is made of a corrosion-resistant material, the light transmission layer can prevent the light reflection layer from altering the first electrode. Consequently, the material of the first electrode can be selected from a wide range of materials.

According to another aspect of the invention, an electroluminescent device is also provided which includes a substrate and a plurality of electroluminescent elements disposed on the substrate. Each electroluminescent element includes a first electrode, an optically transparent second electrodes and a function layer including a luminescent layer and disposed between the first electrode and the second electrode. The electroluminescent elements are grouped into a plurality of groups each including at least one electroluminescent element. Light reflection layers are disposed in an island-shaped manner corresponding to regions where the electroluminescent elements are disposed. Each light reflection layer functions for the at least one electroluminescent element in the corresponding group so as to reflect light emitted from the luminescent layer to direct the light to the second electrode. The light reflection layer has a sufficient thickness to prevent water from transferring from the substrate.

In this structure, the light reflection layers having a sufficient thickness to prevent the transfer of water are provided in an island-shaped manner on the substrate corresponding to regions where the electroluminescent elements are formed. Hence, there are regions having no light reflection layer between any two adjacent light reflection layers. Therefore, by heating the substrate in a stage between the formation of the light reflection layer and the formation of the function layer, water contained in the substrate can be vaporized and released to the outside through the regions having no light reflection layer. Then, the function layer and the electrode are formed over the substrate to complete the electroluminescent element. Thus, water contained in the substrate can be minimized. In addition, the light reflection layers under the respective electroluminescent elements can prevent the permeation into the function layer of water remaining in the substrate, that is, water left in the substrate without being released to the outside in the manufacturing process. Thus, the occurrence of a dark spot can be prevented with reliability.

In this structure, the light reflection layer may be made of aluminum and have a thickness in the range of 100 to 5,000 Å.

Such a light reflection layer can prevent water in the substrate from permeating into the function layer with reliability.

BRIEF DESCRIPTION OF THE DRAWINGS

The invention will be described with reference to the accompanying drawings, wherein like numbers reference like elements.

FIGS. 3A to 3C are schematic representations of a method for manufacturing the organic electroluminescent device according to the first embodiment.

FIG. 5 is a sectional view of a comparative organic electroluminescent device.

FIG. 6 is a sectional view of another comparative organic electroluminescent device.

DESCRIPTION OF EXEMPLARY EMBODIMENTS

First Embodiment

The electroluminescent device of the invention will now be described using an organic electroluminescent device as an embodiment of the invention with reference to the drawings. The organic electroluminescent device according to the embodiment of the invention is of a so-called top emission type, in which light is emitted from the surface opposite to the substrate (at the opposing electrode side).

Figure 1:
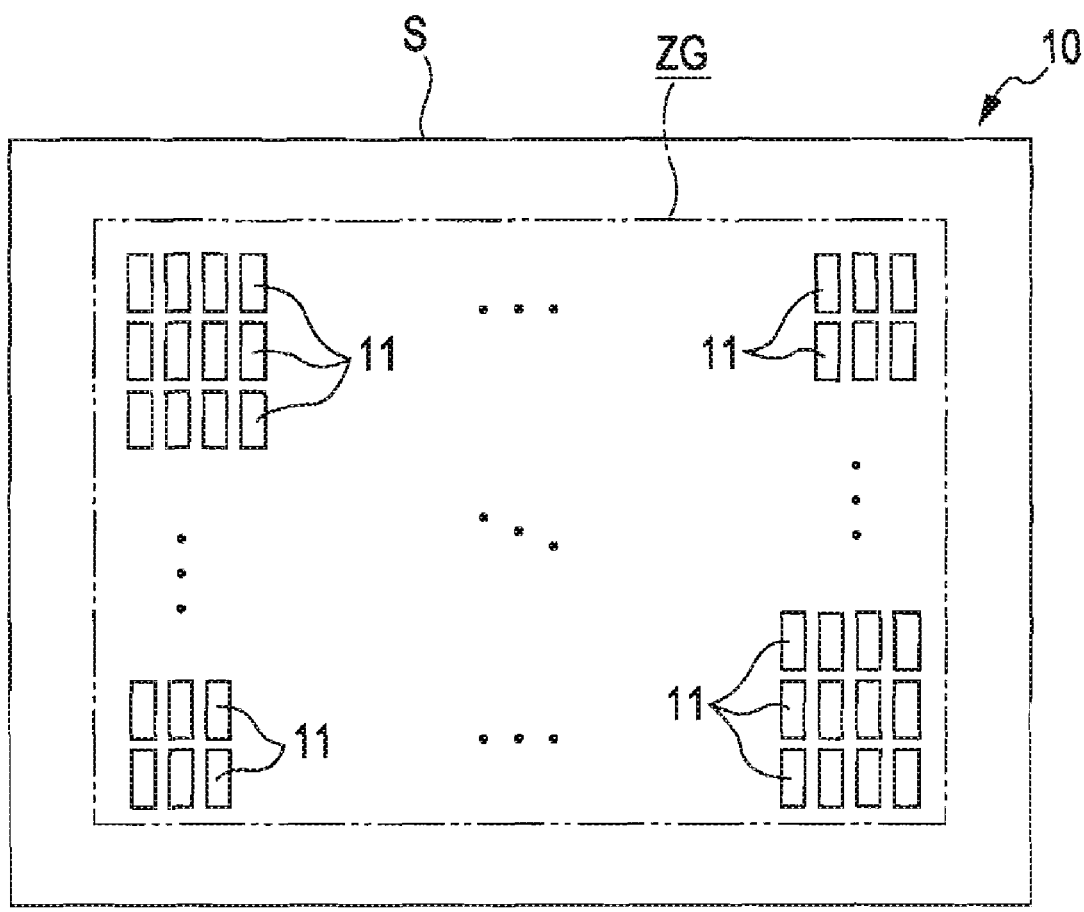
FIG. 1 is a top view of an organic electroluminescent device according to an embodiment of the invention.

As shown in FIG. 1, the organic electroluminescent device (hereinafter referred to as organic EL device) 10 includes a plurality of pixels 11 arranged in a matrix manner in a rectangular region ZG on a substrate or element substrate S. The element substrate S includes a plurality of scanning lines LY extending in a direction (transverse direction in FIG. 2A) and a plurality of data lines LX intersecting the scanning lines LY.

The pixels 11 are disposed at respective intersections of the scanning lines LY and the data lines LX. Each pixel 11 is essentially composed of a known pixel circuit including an organic electroluminescent element (hereinafter referred to as organic EL element 12, a thin film transistors (TFTs) 13a and 13b controlling driving current supplied to the organic EL element 12, and a capacitor element C. More specifically, the TFT 13b serves as an on/off switching element that is switched according to the scanning signal transmitted from the scanning line LY, and the TFT 13a serves as a driving transistor that generates a current (driving current) according the data signal supplied through the data line LX. The capacitor element C accumulations a quantity of electric charge according to the data signal.

Figure 2A:
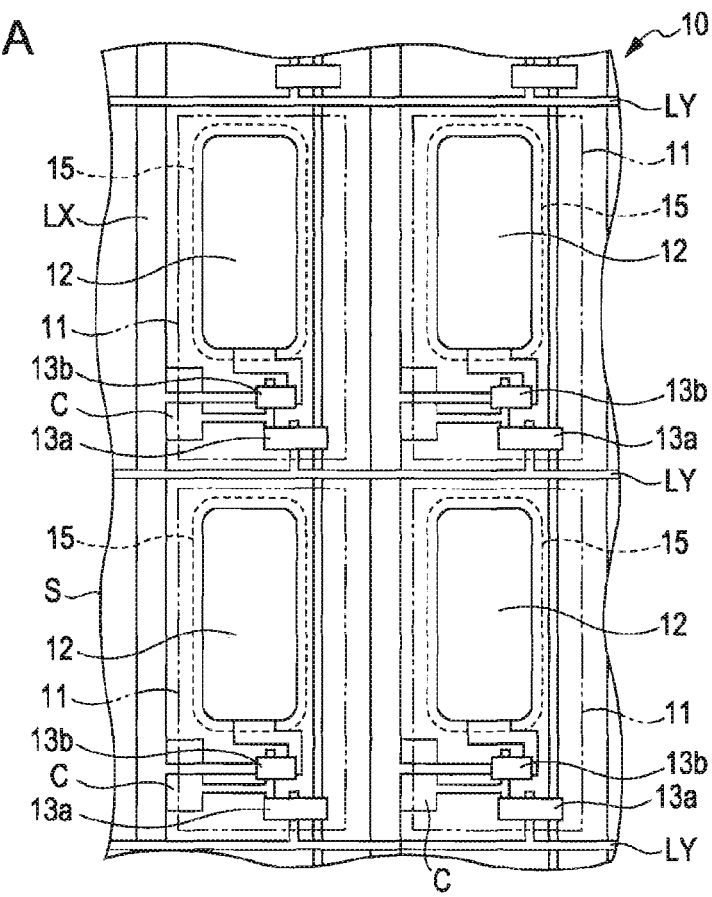
FIG. 2A is a schematic representation of the structure of an organic electroluminescent device according to a first embodiment of the invention.
Figure 2B:
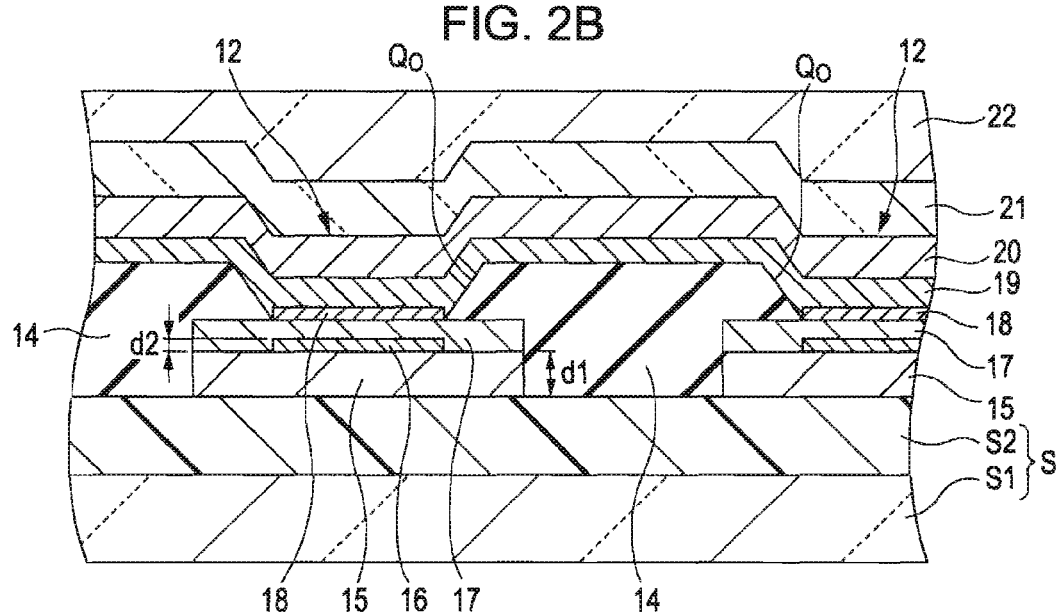
FIG. 2B is a sectional view of the structure.

The element substrate S includes a glass substrate S1 and a circuit-forming layer S2 formed over the surface of the glass substrate S1, as shown in FIG. 2B. The glass substrate S1 is generally made of a non-alkali glass. An acrylic resin substrate may be used as an alternative to the glass substrate S1. The circuit-forming layer S2 includes circuit elements constituting the pixels 11, such as the scanning lines LY, the data lines LX, the TFTs 13a and 13b, and the capacitor elements C, and a planarizing layer covering the circuit elements. The planarizing layer of the present embodiment is made of acrylic resin. The planarizing layer of the circuit-forming layer S2 is sufficiently dried; hence, the planarizing layer contains little water.

An insulating layer 14 is formed on the circuit-forming layer S2 and has openings Qo in the regions where the pixels 11 are formed. The insulating layer 14 is made of the same material as the circuit-forming layer S2, that is, made of acrylic resin in the present embodiment. Barrier layers 15 with a thickness of d1 are formed on the circuit-forming layer S2, corresponding to the positions of the openings Qo of the insulating layer 14. Hence, the barrier layers 15 are arranged in an island-shaped manner corresponding to the regions where the organic EL elements 12 are formed, as shown in FIG. 2A. The barrier layer 15 is made of a material capable of preventing the permeation of water. The barrier layer 15 of the present embodiment is made of silicon nitride (SiN) with a thickness d1 of 5,000 Å.

A light reflection layer 16 is formed on each barrier layer 15. The light reflection layer 16 has such a thickness as it can reflect light emitted from a luminescent layer of a function layer 19 described later. In the present embodiment, the light reflection layer 16 is made of aluminum (Al) with a thickness d2 of 500 Å. The light reflection layer 16 is covered with an optically transparent and electrically insulative light transmission layer 17. The light transmission layer 17 is made of a material corrosion-resistant to the material of the light reflection layer 16 and other materials. The thickness of the light transmission layer 17 is previously adjusted so that light emitted from the pixel 11 can have a desired wavelength.

A pixel electrode 18 being a first electrode is formed on each light transmission layer 17. The pixel electrode 18 is made of an optically transparent electroconductive material. In the present embodiment, the pixel electrode 18 is made of indium tin oxide (ITO). However, the material or the pixel electrode 18 is not limited to ITO, and, for example, zinc oxide (ZnO) may be used. Since the light transmission layer 17 is corrosion-resistant to other materials, as mentioned above, the light reflection layer does not react with pixel electrode 18 to alter it even if the light reflection layer 16 is made of aluminum (Al) as in the present embodiment. Hence, the light transmission layer 17 serves as anti-galvanic corrosion layer.

The pixel electrodes 18 and the insulating layer 14 are covered with a function layer 19. The function layer 19 is a multilayer composite including a luminescent layer made of an organic material and a charge injection layer for efficiently injecting carriers into the luminescent layer. The luminescent layer is made of, for example, a material containing quinolinol aluminum complex (Alq3).

An opposing electrode 20 being a second electrode is formed on the function layer 19. The opposing electrode 20 serves as the opposing electrode to the pixel electrodes 18. The opposing electrode 20 is made of an optically transparent electroconductive material, and is, in the present embodiment, made of a compound containing magnesium and silver (Mg—Ag) to such a small thickness that light can be transmitted. The pixel electrodes 18, the opposing electrode 20, and the function layer 19 between the pixel electrodes 18 and the opposing electrode 20 constitute organic EL elements 12. As described above, the barrier layers 15 are arranged in an island-shaped manner corresponding to the regions where the organic EL elements 12 are formed. For example, the area of the barrier layer 15 may include the region where the pixel electrode 18 is disposed when viewed from above. The opposing electrode 20 may be optically semitransparent. In this instance, light emitted from the luminescent layer of the function layer 19 can repeatedly reflect (resonates) between the light reflection layer 16 and the opposing electrode 20, so that light having a wavelength depending on the distance between the light reflection layer 16 and the opposing electrode 20 is enhanced. This structure is a so-called microcavity structure.

The opposing electrode 20 is covered with an electrode protection layer 21. The electrode protection layer 21 is made of an optically transparent material capable of protecting the opposing electrode 20. In addition, a passivation layer 22 is formed of a known optically transparent material on the electrode protection layer 21.

In the organic EL device 10 thus structured, the barrier layers 15 are disposed on the circuit-forming layer S2 in the regions where the organic EL elements 12 are formed. Consequently, the barrier layer 15 prevents water contained in the acrylic resin planarizing layer of the circuit-forming layer S2 from permeating into the function layer 19. More specifically, the water is prevented from permeating into at least the portions of the function layer 19 overlying the pixel electrodes 18.

Turning now to FIGS. 3A to 3C and 4A to 4C, a method for manufacturing the organic EL device 10 will now be described. First, circuit elements including the scanning lines LY, the data lines LX, and the TFTs 13a and 13b are formed on the glass substrate S1 by lithography or the like. Subsequently, the planarizing layer is formed by vapor-depositing acrylic resin over the circuit elements, followed by CMP treatment. Thus, the circuit-forming layer S2 is formed. Then, silicon nitride (SiN) is deposited on the circuit-forming layer S2 through a mask (not shown) placed on the circuit-forming layer S2, thereby forming barrier layers 15 to a thickness d1 of 5,000 Å in an island-shaped manner in the regions where the organic EL elements 12 are to be formed (see FIG. 3A).

Subsequently, the light reflection layer 16, the light transmission layer 17, the pixel electrode 18, and the insulating layer 14 are formed on each barrier layer 15 in that order. For example, the light reflection layer 16 is formed by vapor-depositing aluminum (Al) to a thickness of d2 (500 Å) on the barrier layer 15, and then an optically transparent material is vapor-deposited so as to cover the light reflection layer 16, thus forming the light transmission layer 17. Subsequently, indium tin oxide (ITO) is vapor-deposited on the light transmission layer 17 to form the pixel electrode 18. Then, acrylic resin is vapor-deposited over the entire surface of the substrate. Then, the acrylic resin layer is etched through a mask (not shown) having openings in regions corresponding to the regions where the pixel electrodes 18 are formed. Thus the insulating layer 14 is formed, having the openings Qo in the resin layer corresponding to the regions where the pixel electrodes 18 are formed (see FIG. 3B).

Then, the resulting element substrate S having the barrier layers 15, the light-reflection layers 16, the light transmission layers 17, the pixel electrodes 18, and the insulating layer 14 is dried. This is performed in the present embodiment by baking the element substrate S in a normal atmosphere at 150° C. for 1 hour. For the baking, a hot plate is used in the present embodiment. Thus, water contained in the element substrate S, the barrier layers 15, the light reflection layers 16, the light transmission layers 17, the pixel electrodes 18, and the insulating layer 14 is heated. The heated water is transferred to the insulating layer 14 through the regions R between the any two adjacent barrier layers 15. Water transferred into the insulating layer 14 is vaporized to the outside from the surface of the insulating layer. In this instance, since the planarizing layer of the circuit-forming layer S2 and the insulating layer 14 are made of the same acrylic resin, water contained in the planarizing layer of the circuit-forming layer S2 can easily be released through the insulating layer 14.

More specifically, in the regions where the organic EL elements 12 are disposed, the barrier layers 15 formed in an island-shaped manner under the organic EL elements 12 prevent the water from permeating into the organic EL elements 12. On the other hand, in the regions where the organic EL elements 12 are not disposed, that is, in the regions R where the barrier layers are not formed, the water can be released to the outside through the insulating layer 14.

Figure 4A:
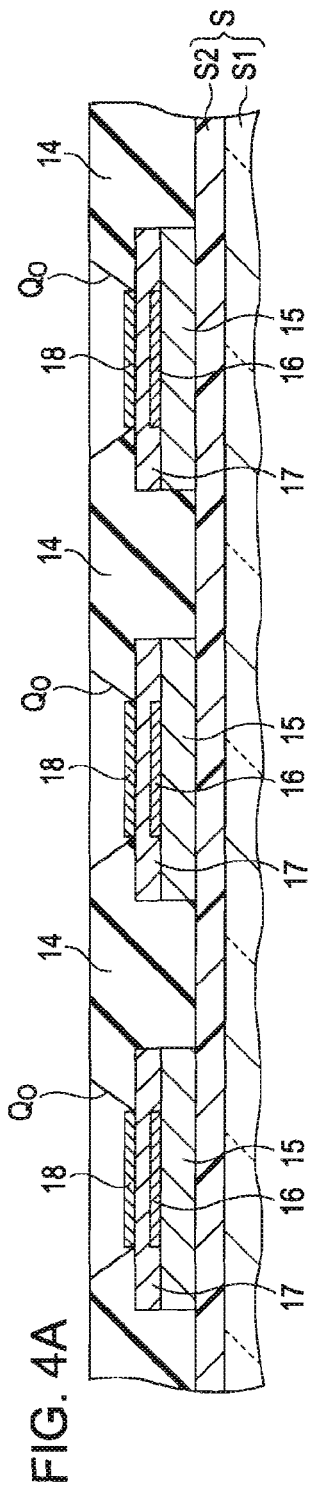
FIGS. 4A to 4C are schematic representations of the method for manufacturing the organic electroluminescent device according to the first embodiment.
Figure 4B:
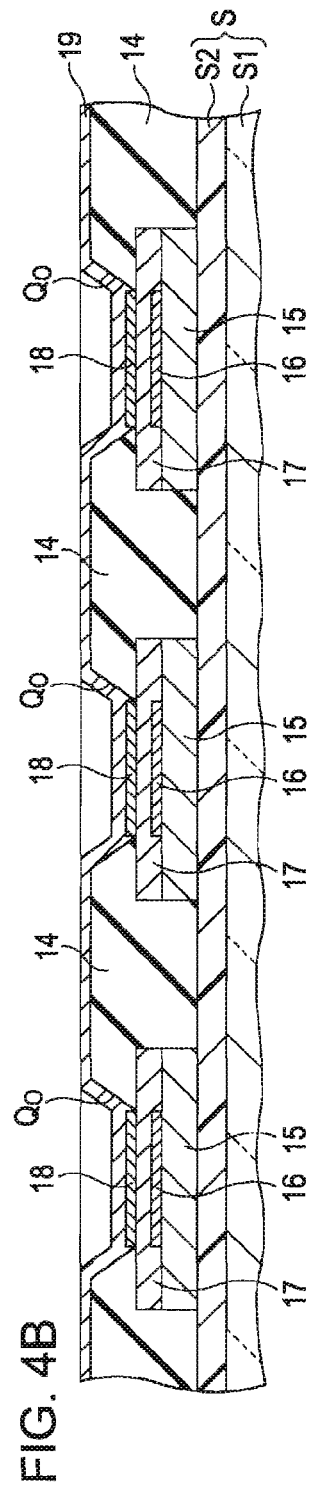

Thus, a structure is completed which includes the insulating layer 14, the barrier layers 15, the light reflection layers 16, and the light transmission layers 17 on the element substrate S including the circuit-forming layer S2 having the planarizing layer containing little water, as shown in FIG. 4A. Subsequently, the function layer is formed on the pixel electrodes 18, as shown in FIG. 4B. This can be performed by applying a liquid prepared by dissolving a material containing quinolinol aluminum complex (Alq3) in a solvent onto the pixel electrodes 18 and the insulating layer 14 by spin coating.

Figure 4C:
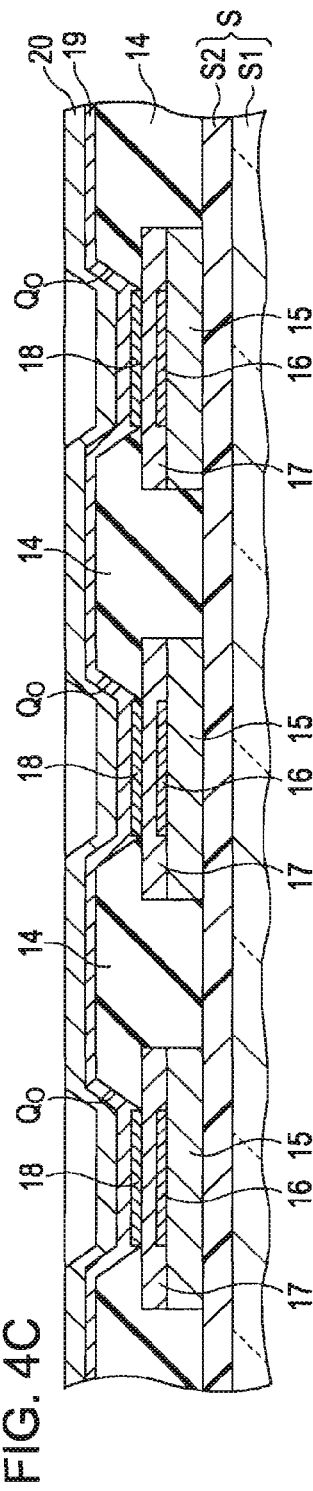

Turning then to FIG. 4C, a compound of magnesium and silver (Mg—Ag) is deposited to form the opposing electrode 20 on the function layer by sputtering. Then, the electrode protection layer 21 and the passivation layer 22 are formed in that order. Thus, the organic EL device 10 is completed.

The operation of the organic EL device 10 will now be described with reference to FIGS. 5 and 6. FIGS. 5 and 6 are each a sectional view of a comparative organic EL device to the organic EL device 10 according to the present embodiment.

The organic EL device 30 shown in FIG. 5 has no barrier layer 15, but the other structure is the same as that of the organic EL device 10 of the present embodiment. The comparative organic EL device 30 was allowed to stand at 95° C. for 500 hours, and then light was emitted from the organic EL elements. As a result, dark spots were observed in a proportion of 200 per square centimeter.

The organic EL device 40 shown in FIG. 6 has the same structure as the organic EL device 10 of the present embodiment except that a barrier layer S3 is formed over the entire surface of the circuit-forming layer S2. This organic EL device 40 was also allowed to stand at 95° C. for 500 hours and then light was emitted from the organic EL elements. As a result, dark spots were observed in a proportion of 300 per square centimeter.

On the other hand, when the organic EL device 10 as shown in FIG. 2B was allowed to stand at 95° C. for 500 hours in the same manner and light was emitted from the organic EL elements, no dark spots were observed in square centimeters.

As described above, the first embodiment produces the following effects:

(1) In the first embodiment, the barrier layers 15 are formed on the circuit-forming layer S2 of the element substrate S in the regions where the organic EL elements 12 are to be formed. Then, before the function layer 19 is formed, the element substrate S is heated to remove water from the circuit-forming layer S2. By heating the element substrate S, water in the circuit-forming layer S2 of the element substrate S can be efficiently vaporized to be removed through the regions where the barrier layers 15 are not disposed. Consequently, the planarizing layer of the circuit-forming layer S2 can be efficiently dried.

(2) In the first embodiment, the function layer 19 and the opposing electrode 20 are formed after sufficiently drying the planarizing layer of the circuit-forming layer S2, and thus the organic EL elements 12 are formed. Consequently, water not vaporized and remaining in the circuit-forming layer S2 is blocked by the barrier layers 15 and prevented from permeating into the function layer 19. Thus, the occurrence of a dark spot is prevented with reliability.

(3) The organic EL device 10 of the first embodiment is of a so-called top emission type that includes the opposing electrode 20 made of an optically transparent material and the light reflection layers 16 each disposed between the corresponding pixel electrode 18 and barrier layer 15 so that light emitted from the luminescent layer of the function layer 19 is directed to the opposing electrode. In the first embodiment, water can be sufficiently removed from the element substrate S of such a top emission type organic EL device. Accordingly, the material of the element substrate can be selected from a wide range of materials.

(4) In the first embodiment, the planarizing layer of the circuit-forming layer S2 and the insulating layer 14 are made of the same material. This makes it easy to release the water contained in the circuit-forming layer S2 to the outside through the insulating layer 14. Consequently, the amount of water contained in the element substrate S can be further reduced, and thus the occurrence of a dark spot can be prevented with reliability.

(5) In the first embodiment, the barrier layer 15 is made of silicon nitride (SiN). Since silicon nitride (SiN) has a closely packed crystal structure, the water contained in the element substrate S can be prevented from permeating into the function layer with reliability.

(6) In the first embodiment, the opposing electrode 20 may be optically semitransparent, and the organic EL element 12 has the light transmission layer 17 between the light reflection layer 16 reflecting light emitted from the luminescent layer and the opposing electrode 20. In this instance, the thickness of the light transmission layer 17 is adjusted so that light having a desired wavelength can resonate according to the optical distance between the light reflection layer 16 and the opposing electrode 20. According to the first embodiment, water in the element substrate S can be prevented from permeating into the organic EL element 12 having such a structure with reliability, and thus the occurrence of a dark spot can be prevented.

(7) In the first embodiment, the light transmission layer 17 is made of a corrosion-resistant material. Consequently, the light reflection layer 16 can be prevented from altering the pixel electrode 18. Consequently, the materials of the pixel electrode 18 and the light reflection layer 16 can be selected from a wide range of materials.

Second Embodiment

An organic EL device 10A according to another embodiment of the invention will now be described with reference to FIG. 7.

Figure 7:
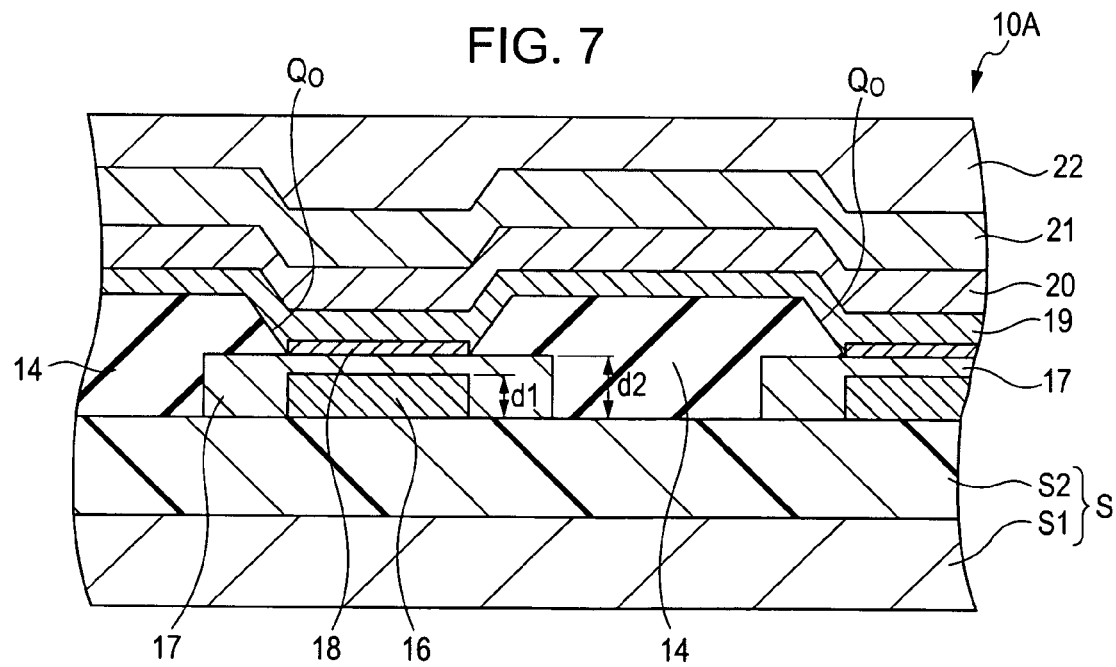
FIG. 7 is a schematic representation of the structure of an organic electroluminescent device according to a second embodiment of the invention.

As shown in FIG. 7, the organic EL device 10A according to the second embodiment does not have the barrier layers 15 provided in the organic EL device 10 of the first embodiment, while the light reflection layer 16 in the second embodiment has such a thickness as can prevent the permeation of water. In the second embodiment, the thickness d2 of the light reflection layer 16 is 4,000 Å.

The second embodiment can produce the following effects:

(1) In the second embodiment, light reflection layers 16 having such a thickness as can prevent the permeation of water are formed on the circuit-forming layer S2 of the element substrate S in the regions where the organic EL elements 12 are disposed. Thus, the light reflection layers are disposed so as to be paired with the opposing electrode 20, thereby forming a micro-cavity structure in the organic EL elements 12. In addition, water not vaporized and remaining in the circuit-forming layer S2 is blocked from permeating into the function layer 19. Thus, the occurrence of a dark spots can be prevented with reliability.

The invention is not limited to the above-described embodiments, and various modifications may be made, for example, as described below.

While the first embodiment provides the barrier layer 15 for each organic EL element 12, this structure does not limit the invention. For example, each 2 to 100 organic EL elements 12 may form a group, and the organic EL elements 12 belonging in the group may have a common barrier layer 15.

Figure 8:
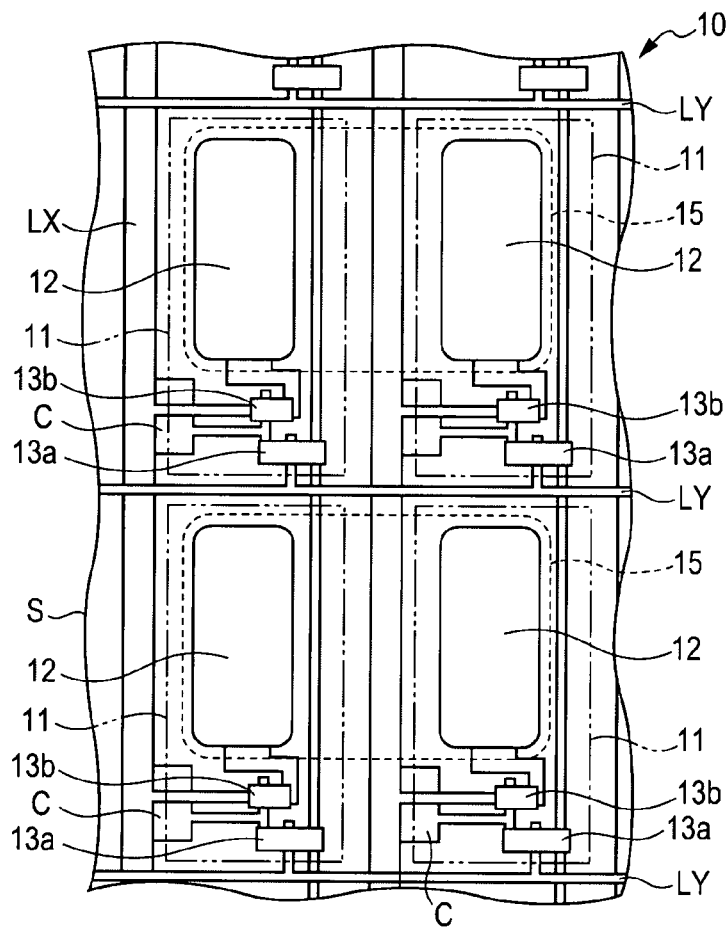
FIG. 8 is another schematic representation of the structure of an organic electroluminescent device according to a second embodiment of the invention

While the second embodiment provides the light reflection layer 16 for each organic EL element 12, this structure does not limit the invention. For example, each 2 to 100 organic EL elements 12 may form a group, and the organic EL elements 12 belonging to the group may have a common light reflection layer 16. FIG. 8 depicts an example where 2 organic EL elements 12 form the first group and 2 organic EL elements 12 form the second group. FIG. 8 also depicts barriers layers 15 corresponding to locations of the first group and the second group, in plan view.

While in the first embodiment, the barrier layer 15 has a thickness of 5,000 Å, the thickness is not limited to this, as long as water contained in the circuit-forming layer S2 can be prevented from transferring and permeating into the function layer 19. For example, the thickness of the barrier layer 15 can be in the range of about 100 to 30,000 Å.

While in the second embodiment, the light reflection layer 16 has a thickness of 5,000 Å, the thickness is not limited to this, as long as water contained in the circuit-forming layer S2 can be prevented from transferring and permeating into the function layer 19. For example, the thickness of the light reflection layer 16 can be in the range of about 100 to 30,000 Å.

While in the above-described embodiments, the opposing electrode 20 is formed over the entire surface of the function layer 19, an auxiliary wiring layer may be provided between the function layer 19 and the opposing electrode 20. This structure can reduce the resistance of the opposing electrode 20 to uniformize the potential at the opposing electrode 20. Consequently, the brightness of the organic EL elements 12 can be uniformized, and thus the quality of displayed images can be enhanced.

While the organic EL devices 10 and 10A of the above-described embodiments are of so-called top emission type that light emitted from the organic EL element 12 is extracted through the opposing electrode 20, the device the invention provides is not limited to this type. A so-called back emission type may be provided, in which light emitted from the organic EL element 12 is extracted through the glass substrate S1. This type also can produce the same effects as the above-described embodiments.

While in the first embodiment, the barrier layer 15 is made of silicon nitride (SiN), any other material may be used without particular limitation. For example, the barrier layer may be made of silicon oxynitride. The use of silicon oxynitride for the barrier layer can reduced the stress more than the use of silicon nitride (SiN), and accordingly the circuit-forming layer S2 of the element substrate S can be formed with reliability.

While the above-described embodiments, the planarizing layer of the circuit-forming layer S2 and the insulating layer 14 are made of acrylic resin, these layers may be made of any other material without particular limitation as long as the planarizing layer and the insulating layer 14 are made of the same material. For example, they may be made of novolak resin.

While the above-described embodiments use organic electroluminescent elements whose function layer is made of an organic material, the electroluminescent element is not limited to this type and the function layer may be made of an inorganic material to embody an inorganic electroluminescent element. In this instance, the resulting display device is not an organic electroluminescent device as described in the embodiments, but an inorganic electroluminescent device.

What is claimed is:

1. An electroluminescent device comprising:
    a substrate;
    a first light-emitting element group and a second light-emitting element group that is different from the first light-emitting element group, the first and second light-emitting element group each including a plurality of light-emitting elements; and
    a first barrier layer and a second barrier layer that prevent water from transferring from the substrate;
    the light-emitting elements including a first electrode, a second electrode, and a light-emitting layer disposed between the first electrode and the second electrode;
    the first barrier layer and the second barrier layer being disposed in a first layer between the substrate and the light-emitting elements;
    the first barrier layer being disposed to completely overlap the light-emitting layers of the plurality of light-emitting elements included in the first light-emitting element group, in plan view;
    the second barrier layer being disposed to completely overlap the light-emitting layers of the plurality of light-emitting elements included in the second light-emitting element group, in plan view; and
    the first barrier layer and the second barrier layer being separate.

2. The electroluminescent device according to claim 1, further comprising a light reflection layer between the first electrode of one of the plurality of light-emitting elements and the first barrier layer disposed so as to correspond to the first light-emitting element group, the light reflection layer reflecting light emitted from the light-emitting layer of the one of the plurality of light-emitting elements to direct the light to the second electrode of the one of the plurality of light-emitting elements, wherein the second electrode is optically transparent.

3. The electroluminescent device according to claim 1, further comprising an insulating layer isolating the light-emitting elements from each other on the substrate, the insulating layer being made of the same material as that of the substrate.

4. The electroluminescent device according to claim 1, wherein the first barrier layer is made of silicon nitride.

5. The electroluminescent device according to claim 1, wherein the first barrier layer is made of silicon oxynitride.

6. The electroluminescent device according to claim 2, further comprising an optically transparent light transmission layer between the light reflection layer and the first electrode, wherein the second electrode is optically semitransparent, and the light transmission layer adjusts the optical distance between the second electrode and the light reflection layer.

7. The electroluminescent device according to claim 1, wherein the first barrier layer is a light reflection layer, the light reflection layer functioning for the one of the plurality of light-emitting elements so as to reflect light emitted from the luminescent layer of the one of the plurality of light-emitting elements to direct the light to the second electrode of the one of the plurality of light-emitting elements.

8. The electroluminescent device according to claim 7, wherein the light reflection layer is made of aluminum and have a thickness in the range of about 100 to 5,000 Å.

* * * * *